(12) United States Patent
Meyer-Berg et al.

(10) Patent No.: US 10,056,295 B2
(45) Date of Patent: Aug. 21, 2018

(54) METHOD FOR HANDLING A PRODUCT SUBSTRATE, A BONDED SUBSTRATE SYSTEM AND A TEMPORARY ADHESIVE

(71) Applicant: Infineon Technologies AG, Neubiberg (DE)

(72) Inventors: Georg Meyer-Berg, Munich (DE); Claus von Waechter, Sinzing (DE); Michael Bauer, Nittendorf (DE); Holger Doepke, Sinzing (DE); Dominic Maier, Pleystein (DE); Daniel Porwol, Straubing (DE); Tobias Schmidt, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 15/002,009

(22) Filed: Jan. 20, 2016

(65) Prior Publication Data
US 2016/0218039 A1    Jul. 28, 2016

(30) Foreign Application Priority Data
Jan. 21, 2015    (DE) .......................... 10 2015 100 863

(51) Int. Cl.
*H01L 21/78* (2006.01)
*H01L 21/683* (2006.01)
(Continued)

(52) U.S. Cl.
CPC .............. *H01L 21/78* (2013.01); *B32B 37/26* (2013.01); *H01L 21/565* (2013.01); *H01L 21/6835* (2013.01); *H01L 23/562* (2013.01); *H01L 2221/68318* (2013.01); *H01L 2221/68327* (2013.01); *H01L 2221/68381* (2013.01);
(Continued)

(58) Field of Classification Search
CPC . H01L 2221/68318; H01L 2221/68386; Y10T 156/1168; Y10T 156/1195; Y10T 156/1978; Y10T 156/1994; Y10S 156/93; Y10S 156/941; B32B 37/26
See application file for complete search history.

(56) References Cited

U.S. PATENT DOCUMENTS 5,026,748 A    6/1991    Adams et al.
6,391,082 B1    5/2002    Holl
(Continued)

FOREIGN PATENT DOCUMENTS

CN    1420904 A    5/2003
CN    102399443 A    4/2012
DE    202009018064 U1    12/2010

*Primary Examiner* — Mark A Osele
(74) *Attorney, Agent, or Firm* — Murphy, Bilak & Homiller, PLLC

(57) ABSTRACT

A method for handling a product substrate includes bonding a carrier to the product substrate. A layer of a permanent adhesive is applied onto a surface of the carrier. A structured intermediate layer is provided. The applied permanent adhesive bonds the carrier to the product substrate. The structured intermediate layer is arranged between the product substrate and the carrier. A surface of the structured intermediate layer and a surface of the permanent adhesive are in direct contact to a surface of the product substrate. The structured intermediate layer decreases a bonding strength between the product substrate and the carrier.

11 Claims, 11 Drawing Sheets

(51) Int. Cl.
    *B32B 37/26*     (2006.01)
    *H01L 21/56*     (2006.01)
    *H01L 23/00*     (2006.01)
    *H05K 3/00*     (2006.01)

(52) U.S. Cl.
    CPC ............. *H05K 3/007* (2013.01); *Y10S 156/93* (2013.01); *Y10S 156/941* (2013.01)

(56) References Cited

U.S. PATENT DOCUMENTS

2005/0221598 A1    10/2005    Lu et al.
2011/0308739 A1*  12/2011    McCutcheon ........ H01L 21/187
                                                      156/766

* cited by examiner

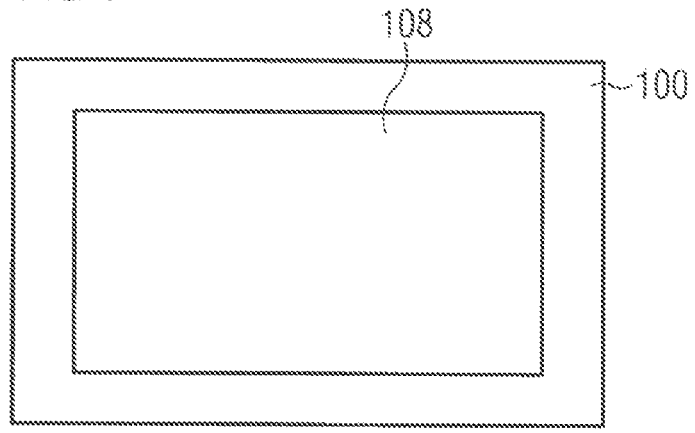
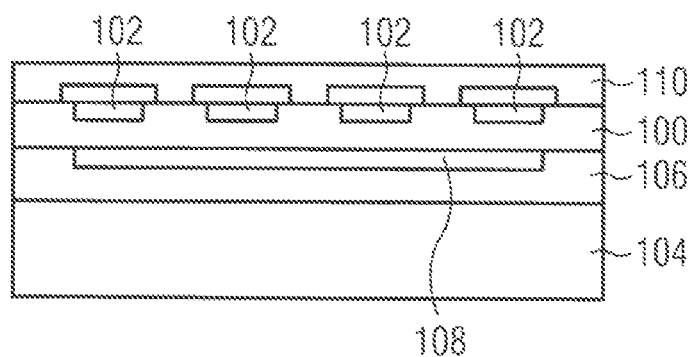
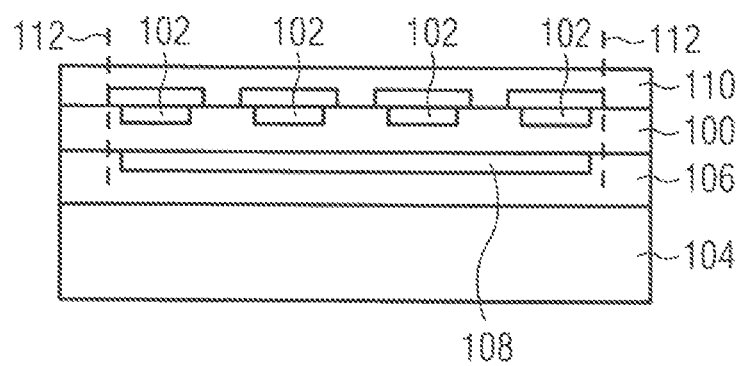

METHOD FOR HANDLING A PRODUCT SUBSTRATE, A BONDED SUBSTRATE SYSTEM AND A TEMPORARY ADHESIVE

PRIORITY CLAIM

This application claims priority to German Patent Application No. 10 2015 100 863.7 filed on 21 Jan. 2015, the content of said application incorporated herein by reference in its entirety.

TECHNICAL FIELD

The present disclosure relates to a method for handling a product substrate comprising bonding a carrier to the product substrate. The present disclosure further relates to a bonded substrate system comprising a carrier and a product substrate. The present disclosure further relates to a temporary adhesive.

BACKGROUND

Handling a wafer during processing steps may be difficult because of a fragility of the wafer. Another difficulty may arise from the fact that a wafer, in particular a reconstituted wafer, is subject to warpage.

A carrier which is temporarily bonded to the wafer can enhance the stability during handling and may straighten a warped wafer. The carrier may be debonded from the wafer after performing all necessary processing steps. For temporarily bonding a temporary carrier to the wafer a temporary adhesive may be used.

Temporary adhesives, e.g. in the form of adhesive films, are frequently used in semiconductor industry. Temporary adhesives in the meaning of this application are adhesives which are intended to bond two components only temporarily together. Known temporary adhesives are operative in a temperature range starting from about room temperature (20° C.) up to about 180° C., 200° C. or sometimes up to about 250° C. Often, the higher temperatures are only supported during a short time period without debonding. Additionally, even lower temperatures, i.e. temperatures below 180° C. may lead to a debonding if a mechanical force acts upon the adhesive layer. Two different mechanisms are used for temporary adhesives. Temporary adhesives either have a low adhesive force which allows an easy mechanical debonding or they allow for a controlled destruction of their adhesive force. Both mechanisms may also be combined. Known destruction mechanisms comprise, for example, chemically dissolving the temporary adhesive, destroying/ decreasing the adhesive force by heat with temperatures above the designated temperature range or by radiation.

Temporary adhesives may have the disadvantage that conditions encountered during processing the wafer may deactivate the adhesive force of the temporary adhesive or at least severely reduce the adhesive force. A low adhesive force may not be sufficient to straighten a warped wafer and/or to hold a wafer securely during all processing steps. For these and further reasons there is a need for the present invention.

SUMMARY

According to an embodiment of a method for handling a product substrate, the method comprises bonding a carrier to the product substrate by: applying a layer of a permanent adhesive onto a surface of the carrier; providing a structured intermediate layer; and bonding the carrier to the product substrate using the applied permanent adhesive. The structured intermediate layer is arranged between the product substrate and the carrier. A surface of the structured intermediate layer and a surface of the permanent adhesive are in direct contact to a surface of the product substrate. The structured intermediate layer decreases a bonding strength between the product substrate and the carrier.

According to an embodiment of a bonded substrate system, the bonded substrate system comprises a carrier, a product substrate, a layer of permanent adhesive bonding the carrier to the product substrate, and a structured intermediate layer arranged between the product substrate and the carrier. A surface of the structured intermediate layer and a surface of the permanent adhesive are in direct contact to a surface of the product substrate. The structured intermediate layer decreases a bonding strength between the product substrate and the carrier.

According to an embodiment of a temporary adhesive, the temporary adhesive comprises an adhesive component having a first coefficient of thermal expansion and a filler material having a second coefficient of thermal expansion. The second coefficient of thermal expansion is smaller than the first coefficient of thermal expansion. An adhesive force of the temporary adhesive weakens at a temperature below 0° C.

According to another embodiment of a bonded substrate system, the bonded substrate system comprises a carrier, a product substrate, and a layer of a temporary adhesive comprising an adhesive component having a first coefficient of thermal expansion and a filler material having a second coefficient of thermal expansion. The second coefficient of thermal expansion is smaller than the first coefficient of thermal expansion. An adhesive force of the temporary adhesive weakens at a temperature below 0° C. The temporary adhesive bonds the carrier to the product substrate.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments and are incorporated in and constitute a part of the description. The drawings illustrate examples and together with the description serve to explain principles of embodiments. Other embodiments and many of the intended advantages of embodiments will be readily appreciated as they become better understood by reference to the following detailed description.

FIG. 7 schematically illustrates a bottom view of the product substrate of FIG. 6.

FIG. 8 schematically illustrates in a sectional view the bonded substrate system of FIG. 5 after further processing steps.

FIG. 9 schematically illustrates in a sectional view the bonded substrate system as shown in FIG. 8 with possible cutting lines.

DETAILED DESCRIPTION

Figure 1:
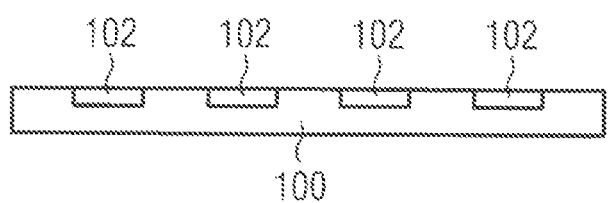
FIG. 1 schematically illustrates a product substrate.

In the following detailed description reference is made to the accompanying drawings which illustrate specific aspects in which the disclosure may be practiced. In this regard, directional terminology, such as "top", "bottom", "front", "back", etc. may be used with reference to the orientation of the figures being described. The directional terminology is used for purposes of illustration and is in no way limiting.

The various aspects summarized may be embodied in various forms. The following description shows by way of illustration various combinations and configurations in which the aspects may be practiced. It is understood that the described aspects and/or examples are merely examples and that other aspects and/or examples may be utilized and structural and functional modifications may be made without departing from the concept of the present disclosure. The following detailed description is therefore not to be taken in a limiting sense, and the concept of the present disclosure is defined by the appended claims. In addition, while a particular feature or aspect of an example may be disclosed with respect to only one of several implementations, such feature aspects may be combined with one or more other features or aspects of the other implementations as it may be desired and advantages for any given or particular application.

It is to be appreciated that features and/or elements and/or layers depicted herein may be illustrated with particular dimensions relative to each other for purposes of simplicity and ease for understanding. Actual dimensions of the features and/or elements and/or layers may differ from that illustrated herein.

To the extent that the terms "include", "have", "with" or other variants thereof are used in either the detailed description or the claims, such terms are intended to be inclusive in a manner similar to the term "comprise" Also the term "exemplary" is merely meant as "an example", rather than as "best" or "optimal".

A method for handling a product substrate and a bonded substrate system are described herein. Comments made in connection with the described method may also hold for a corresponding bonded substrate system and vice versa. For example, when a specific component or material of a product substrate or a carrier is described, a corresponding method for handling a product substrate may include the same kind of product substrate or the same material for a product substrate and the same kind of carrier or the same kind of material for a carrier, even when such act is not explicitly described or illustrated in figures. A sequential order of acts of a described method may be changed if technically possible. At least two acts of a method may be performed at least partly at the same time. In general, the features of the various exemplary aspects described herein may be combined with each other, unless specifically noted otherwise.

A product substrate in accordance with the disclosure may comprise two or more semiconductor chips. For example, a product substrate may be or may comprise a semiconductor wafer in which semiconductor chips are formed by known processes as doping, implantation, deposition, etching, coating, metallization, etc. The semiconductor wafer may be of any semiconductor material as silicon (Si), gallium arsenide (GaAs), indium phosphide (InP), etc.

A product substrate may also be or comprise a reconstituted wafer. In a reconstituted wafer singulated semiconductor chips are embedded in a mold compound. An example of a reconstituted wafer is an embedded wafer level ball grid array (eWLB). A reconstituted wafer may comprise semiconductor chips which may be similar to each another or which may be different. Two or more chips in a reconstituted wafer may be combined later into one semiconductor device.

A product substrate may also be a laminate substrate or a circuit board. A laminate substrate may be formed by using a prepreg material. A prepreg material may comprise pre-impregnated composite fibers in a matrix material such as epoxy. Semiconductor chips may be embedded in the prepreg material.

A carrier material in accordance with the disclosure may be adapted to the product substrate in terms of its coefficient of thermal expansion (CTE) or short expansion coefficient. The carrier material may be chosen to be a rigid material. A thickness of the carrier may be chosen to provide a sufficient or desired rigidness depending on the carrier material. A carrier in accordance with the disclosure may be or may comprise a plastic disc or board. A carrier in accordance with the disclosure may be or may comprise a metal, especially a base metal, glass or ceramic plate. The carrier may be made of or may comprise an iron-nickel-alloy. The carrier substrate may be made of or may comprise an iron-nickel-alloy comprising about 36% of nickel which is also known as invar. The carrier substrate may also be made of or may comprise an iron-nickel-alloy comprising about 42% of nickel which is also known as alloy42 and is a commonly used leadframe material. A carrier in accordance with the disclosure may be of or may comprise any other suitable material, i.e. a material providing a sufficient rigidness, being adapted in its CTE to the product substrate to be handled and resistant to the temperatures and chemicals used throughout the product substrate processing performed while bonded to the carrier.

The product substrate and the carrier may be adapted to each other in terms of their dimensions. The product substrate and the carrier may both be of a circular form. Especially wafers and reconstituted wafers may be of a circular form with a diameter of about 8 inches to about 12 inches (1 inch corresponding to 2.54 cm). The diameter may also be greater or smaller. The product substrate and the carrier may also both be of a rectangular form. Especially laminate products such as e.g. printed boards may be rectangular. The product substrate and the carrier may also be of different form. The product substrate and the carrier may have any other form than rectangular or circular.

A permanent adhesive in accordance with the disclosure may be an adhesive which is intended to permanently bond together two objects. Especially and in contrast to a temporary adhesive, a permanent adhesive is not provided with a capability to be destroyed by thermal, chemical or mechanical means as may be temporary adhesives. A permanent adhesive may provide a high adhesive force which does not allow for easy mechanical debonding. For example, permanent adhesives may be used in semiconductor industries for fixing a semiconductor chip to a leadframe or another carrier, thereby forming a semiconductor device. In this case, the carrier may be permanently fixed to the chip. Thus, a permanent adhesive may be designed to withstand environmental conditions which the semiconductor chip respectively the semiconductor device encounters during packaging, mounting and life cycle. A permanent adhesive may, for example, accept temperatures above 300° C. without debonding. A permanent adhesive may, for example, accept temperatures up to 400° C. without debonding. A permanent adhesive may also withstand chemicals used during packaging, mounting, etc. A permanent adhesive may be or may comprise a dielectric medium. A permanent adhesive may be or may comprise a polymer system. Examples for permanent adhesives are e.g. epoxide, polyimide, silicone, polybenzoxazole (PBO) or thermoplastics in general.

A permanent adhesive may need to be cured for bonding. Curing may mean that the permanent adhesive may be applied in a liquid form and consolidated or hardened under heat or irradiation, for example. Curing of a permanent adhesive before joining the two objects to be bonded together may decrease or even annul the adhesive force of the permanent adhesive. A layer thickness of a permanent adhesive in accordance with the disclosure may be of up to 100 μm (micrometer).

An adhesive force provided by a permanent adhesive may depend on the object which is bonded. The adhesive force may depend on a surface structure of the object to be bonded and/or on a material to be bonded. A specific permanent adhesive is designed for the specific materials and surfaces to be bonded. In the following figures a method for handling a product substrate is illustrated.

A structured intermediate layer in accordance with the disclosure may be arranged between a product substrate and a carrier to be bonded with a permanent adhesive. The intermediate layer may be structured to cover a smaller or greater percentage of a surface of the product substrate or, in other words, to expose a greater or smaller percentage of the surface of the product substrate to the permanent adhesive. With a given adhesive force between the permanent adhesive and the surface of the product substrate, a bonding force bonding the carrier to the product substrate depends on the surface of the product substrate exposed to the permanent adhesive. The greater the surface of the product substrate exposed to the permanent adhesive, the greater the bonding force between product substrate and carrier.

The intermediate layer material may be chosen to develop a much lower adhesive force to the permanent adhesive compared to the adhesive force between permanent adhesive and product substrate. Consequently, the greater the surface of the intermediate layer exposed to the permanent adhesive, the smaller the general bonding force between product substrate and carrier. Furthermore, the structure of the intermediate layer may allow distributing the bonding force as needed over the surface of the product substrate with regions with less bonding force and regions with more bonding force.

FIG. 1 illustrates in a sectional view a product substrate 100 in accordance with the disclosure. The product substrate 100 comprises, as an example, four semiconductor chips or electrical circuits 102. In the example of FIG. 1, the semiconductor chips 102 are arranged next to an upper surface of the product substrate 100. They do not reach a lower surface of the product substrate 100. The product substrate 100 may be a laminate substrate with integrated chips. The product substrate 100 may need a temporary support for handling. The product substrate 100 is a product substrate to be handled. For example, the product substrate 100 may be subject to warpage.

Figure 2:
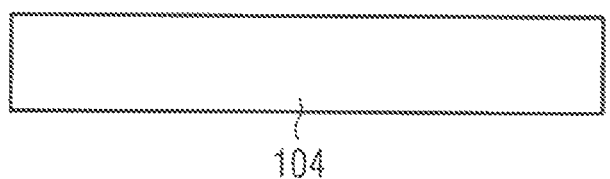
FIG. 2 schematically illustrates a carrier.

FIG. 2 shows a carrier 104 in accordance with the disclosure. The carrier 104 may be adapted to the product substrate 100 with regard to its dimensions and its CTE. The carrier 104 may be adapted to support the product substrate 100 during handling and/or processing.

Figure 3:
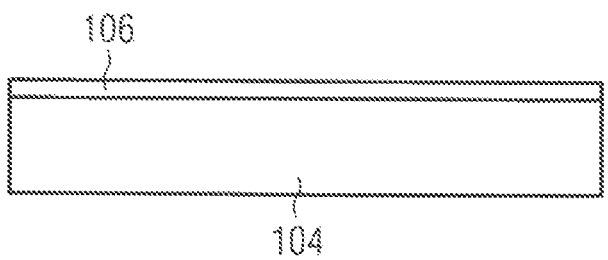
FIG. 3 schematically illustrates a carrier with an applied layer of permanent adhesive.

FIG. 3 shows the carrier 104 of FIG. 2 with an applied layer of permanent adhesive 106. The permanent adhesive 106 is not yet cured. The permanent adhesive 106 may be chosen to develop a high bonding force between the carrier 104 and the product substrate 100. The permanent adhesive 106 may be chosen to adhere with a high adhesive force to the product substrate 100 and to the carrier 104.

Figure 4:
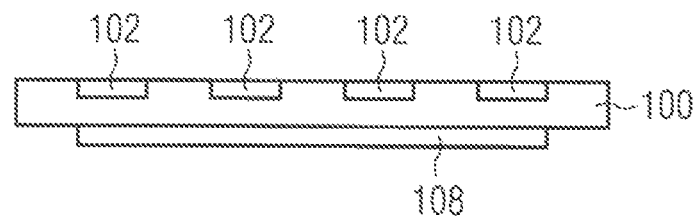
FIG. 4 schematically illustrates a product substrate with a structured intermediate layer.

FIG. 4 shows the product substrate 100 of FIG. 1 with an intermediate layer 108 arranged on the lower surface of the product substrate 100. The lower surface of the product substrate 100 is opposite the surface near which the chips 102 are arranged. The intermediate layer 108 may be structured while being applied onto the product substrate 100. Structuring may be effectuated, for example, by any printing process using a mask. Printing may be carried out as a screen print process or a stencil print process, for example. A dispensing process like an ink jet process is also possible.

The intermediate layer 106 may also be deposited unstructured onto the lower surface of the product substrate 100 and may be structured afterwards. The intermediate layer 106 may be applied to the lower surface of the product substrate 100 by any known technique of coating such as, for example, sputtering, vapor deposition, spin coating, spraying, etc. Structuring may then be effectuated, for example, by applying a mask and etching. Other ways of structuring are also possible. A thickness of the intermediate layer 108 may be of several hundreds of nm up to 10 μm (micrometer) or up to 20 μm (micrometer). By structuring the intermediate layer 108 parts of the underlying surface of the product substrate 100 are exposed.

Figure 5:
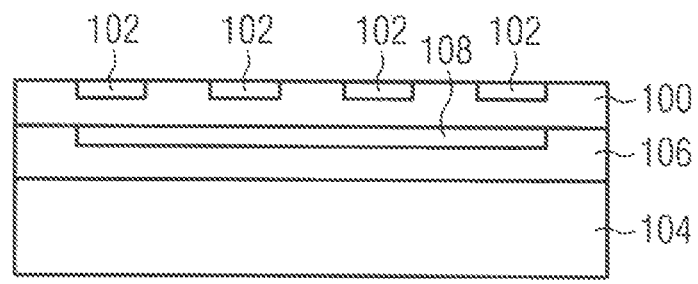
FIG. 5 schematically illustrates the carrier of FIG. 3 bonded to the product substrate of FIG. 4 forming a bonded substrate system.

FIG. 5 shows the product substrate 100 and the intermediate layer 108 bonded to the carrier 104 using the permanent adhesive 106. FIG. 5 shows a bonded substrate system in accordance with the disclosure. As can be seen in FIG. 5, the structured intermediate layer 108 is arranged between the product substrate 100 and the carrier 104. When bringing the carrier 104 and the product substrate 100 into contact, the permanent adhesive 106 is still in a liquid form and the intermediate layer 108 penetrates into the permanent adhesive 106. A surface of the structured intermediate layer 108 and a surface of the permanent adhesive 106 are in direct contact to the lower surface of the product substrate 100. The structured intermediate layer 108 decreases the surface of the product substrate 100 which is in direct contact to the permanent adhesive 106. The structured intermediate layer 108 decreases a bonding strength between the product substrate 100 and the carrier 104. No gap or cavity is formed or remains between the carrier 104 and the product substrate 100. As there is no gap or cavity between the product substrate 100 and the carrier 104, no chemicals may enter between the two substrates in subsequent processing steps. Furthermore, thermal cycles as encountered during further processing do not provoke delamination due to possible gas bulbs formed between the carrier 104 and the product substrate 100. Furthermore, this allows surviving vacuum processes without delamination. It is to be understood that once the product substrate 100 and the carrier 104 are brought together the permanent adhesive is cured to harden and to produce the desired adhesive force.

In an example, the material of the intermediate layer 108 is chosen to interact with the permanent adhesive 106 as little as possible leading to a very small adhesive force between the permanent adhesive 106 when cured and the intermediate layer 108. At the same time, the permanent adhesive 106 bonds to the product substrate 100 with a high adhesive force. The adhesive force or the first adhesive force between the permanent adhesive 106 and the product substrate 100 is much higher than the second adhesive force between the permanent adhesive 106 and the intermediate layer 108. In an example, the intermediate layer 108 may be a non-stick coating. In an example, the intermediate layer 108 may comprise polytetrafluorethylene (PTFE) which is known under the brand name teflon. In an example, the intermediate layer 108 may be of a metal or more precisely of a noble or precious metal. A possible material for the intermediate layer 108 is also more generally a fluoride. In an example the product substrate 100 may be of a base metal or a coated metal or an oxidized metal. In an example the product substrate 100 may be of glass or ceramic. In an example the product substrate 100 may have a rough or coarse surface.

Figure 6:
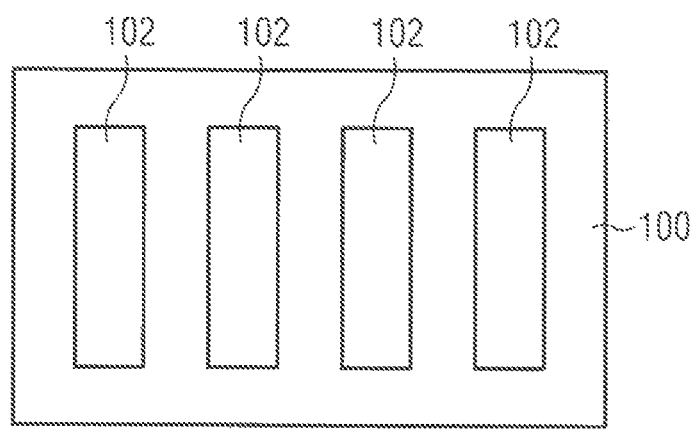
FIG. 6 schematically illustrates a top view of a possible product substrate.

FIG. 6 shows in a top view the product substrate 100. Exemplary, the product substrate 100 comprises four circuits 102. The product substrate 100 may be a laminate substrate of a rectangular form.

FIG. 7 shows a schematic bottom view of the product substrate 100 of FIG. 6. According to the present example, the intermediate layer 108 is structured to leave an outer region of the product substrate 100 exposed. The intermediate layer 108 may be structured according to a warpage behavior of the board 100. In an example which is not shown, the intermediate layer 108 may be further structured to expose a second region of the product substrate 100 in the form of a frame inside the exposed outer frame shown in FIG. 6. More generally, the intermediate layer 108 may be structured to expose regions of the surface of the product substrate 100 which need to be securely attached to the carrier substrate 104 to avoid or at least to decrease warpage. The smaller the surface of the structured intermediate layer 108, the larger the exposed surface of the product substrate 100 and the greater the bonding force of the permanent adhesive 106 between carrier and the product substrate. In other words, the structured intermediate layer may be structured to allow a greater surface of the permanent adhesive contact the product substrate in regions of greater warpage and to allow a smaller surface of the permanent adhesive contact the product substrate in regions of less warpage.

FIG. 8 shows in a schematic side or sectional view the bonded substrate system of FIG. 5 comprising a layer 110 arranged on top of the product substrate 108. The layer 110 may comprise a plurality of different layers and include, for example, redistribution layers, i.e. layers of interconnection or wiring. The layer 110 is created during further process steps effectuated on the product substrate 100 while being bonded to the carrier 104. Effectuating these process steps on the bonded substrate system has the advantage that the product substrate is not distorted, twisted or bent but has a plane surface. For example, photolithographic steps may be carried out with high precision over the whole surface of the product substrate 100. It is also an advantage that the bonded substrate system is more robust than the product substrate alone which facilitates handling. Temperatures encountered during the process steps may be up to 350° C. for a reconstituted or molded wafer and up to 450° C. for silicon wafer.

FIG. 9 shows in a schematic sectional view the bonded substrate system of FIG. 8 with possible cut lines indicated by dashed lines 112. Dashed lines 112 do not extend through carrier 104. Cutting is stopped before carrier 104 which remains intact. It should be remembered that the carrier 104 is a temporary carrier allowing handling of the product substrate during further process steps. Not cutting into carrier 104 allows reuse of carrier 104. The carrier 104 is intended to be separated from the product substrate 100 after a number of process or processing steps have been effectuated. When cutting along the lines 112, which are near but distant the structured intermediate layer 108 and—not shown—all around the structured intermediate layer 108, the intact carrier will still adhere to the product substrate but only on a very small surface. The bonding force is thus sufficiently decreased to render it possible to detach the product substrate 100 from the carrier 104 by mechanical means. In an example, the bonded substrate system is cut along sawing lines which cut in the intermediate layer so that after cutting no bonding force is left between the carrier 104 and the product substrate 100 or at least only the little bonding force given by the small adhesive force to the intermediate layer 108.

Figure 10:
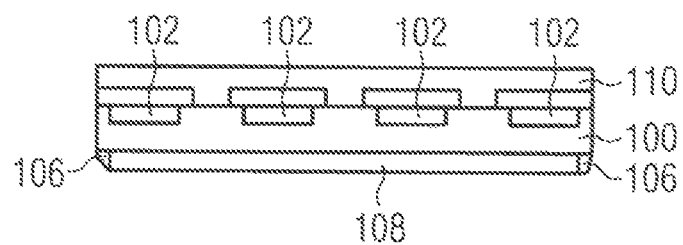
FIG. 10 schematically illustrates the product substrate of the bonded substrate system as shown in FIG. 9 after separation from the carrier.

FIG. 10 shows the product substrate 100 from FIG. 9 after being separated from the carrier 104. Only small rests of the permanent adhesive 106 remain after the mechanical separation. No permanent adhesive 106 remains on the intermediate layer 108 because the intermediate layer 108 is non-sticking and the adhesive force between the permanent adhesive 106 and the intermediate layer 108 is very low. It is possible to effectuate now a grinding step or an etching process to remove the intermediate layer 108 and the rest of the permanent adhesive 106. In other examples, these rests may remain.

Figure 11:
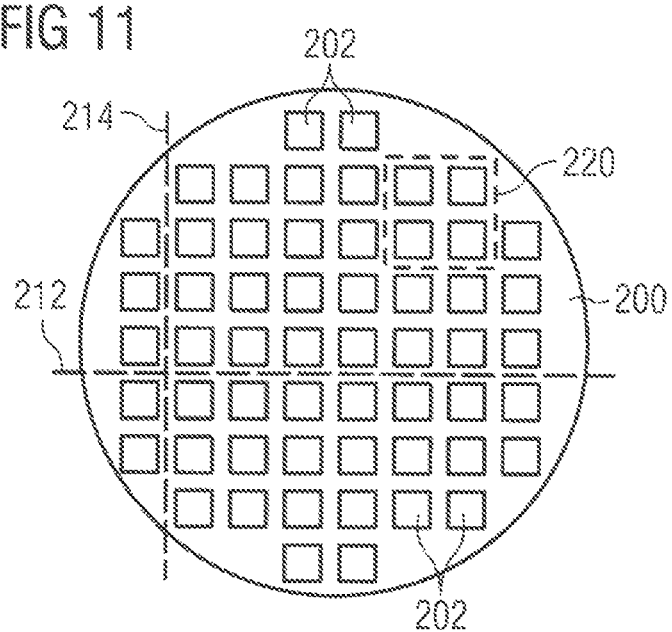
FIG. 11 schematically illustrates a further possible carrier in a top view.

FIG. 11 shows in a top view a product substrate 200 according to a further example. The product substrate 200 may be a semiconductor wafer or a reconstituted wafer. The product substrate 200 may be of a circular form and may comprise a plurality of integrated circuit chips 202. As known in the art, the chips 202 may be processed in parallel on the wafer and may be singulated afterwards along saw lines, two of which are indicated by dashed lines 212. The chips 202 may be of any kind, they may be equal to each other or different. The wafer 200 may easily break, for example due to the used material or the thickness of the wafer in relation to the diameter of the wafer, for example in case of a slim wafer. Especially for reconstituted wafers the product substrate 200 may also be subject to warpage. Warpage occurs for reconstituted wafers e.g. because of a CTE mismatch between the semiconductor material of the chips and the molding compound used to form the reconstituted wafer. A structured intermediate layer may be applied to a backside of the product substrate 200. All details given above for an intermediate layer apply for the present example as well and are not repeated. A small region of the wafer 200 indicated by a dashed line 220 forming a square will be used to explain further details of possible structures of the intermediate layer in FIGS. 12 to 15.

Figure 12:
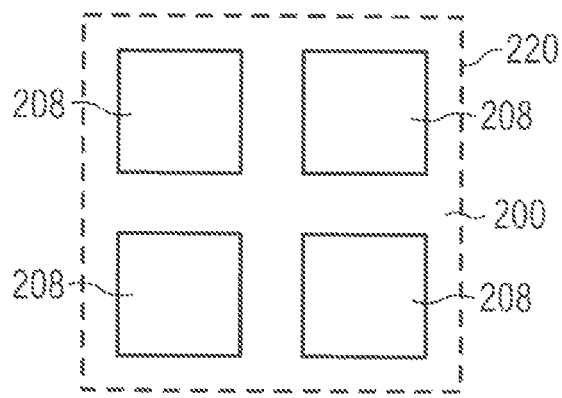
FIG. 12 schematically illustrates in a bottom view an enlarged portion of the carrier of FIG. 11 with a possible structured intermediate layer.

FIG. 12 shows in an enlarged bottom view the square region 220 of the wafer 200 as indicated in FIG. 11. Underneath the chips 202 inside the square 220 a structured intermediate layer 208 is applied. The intermediate layer 208 is structured to cover portions of the back surface of the wafer 200 opposite the chips 202. It is understood that the shown detail is applicable to the whole wafer. In other words, underneath every chip 202 an intermediate layer 208 is arranged on the back side of the wafer 200. In other words, the intermediate layer 208 is structured to expose a back side of the wafer 200 along the sawing lines or kerfs. The intermediate layer 208 is structured to contact the product substrate essentially only apart the saw lines. As already explained previously, the material of the intermediate layer 208 is chosen to have a low adhesive force to a permanent adhesive used to bond the wafer 200 to a carrier.

Figure 13:
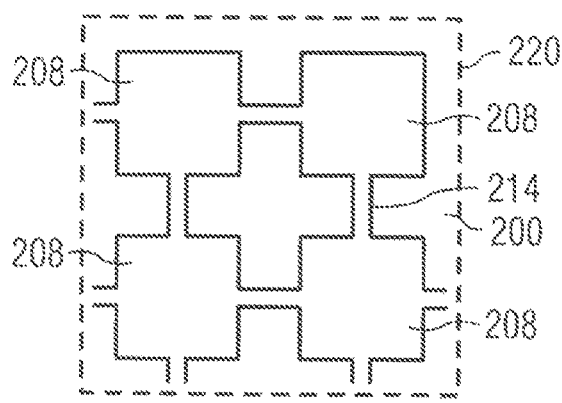
FIG. 13 schematically illustrates in a bottom view the enlarged portion of the carrier of FIG. 11 with another possible structured intermediate layer.

FIG. 13 shows in an enlarged bottom view the square region 220 of wafer 200 (see FIG. 11) comprising another example of a structured intermediate layer 208. Again, the intermediate layer 208 is structured to cover the backside of the wafer 200 underneath the chips 202 formed on the front side of the wafer 200. In contrast to the example explained with reference to FIG. 12, the intermediate layer surfaces underneath the chips 202 are interconnected by webs 214 crossing the sawing lines.

Figure 14:
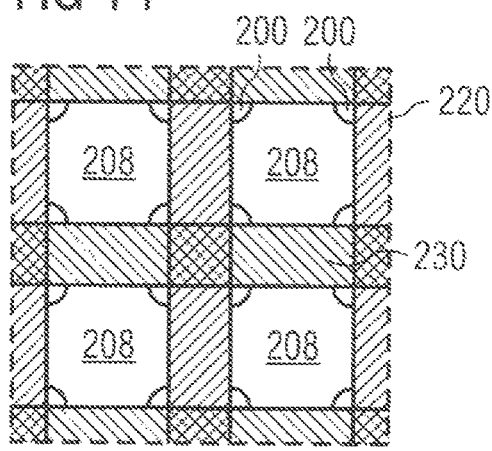
FIG. 14 schematically illustrates in a bottom view the enlarged portion of the carrier of FIG. 11 with another possible structured intermediate layer.

FIG. 14 shows another example of a structured intermediate layer 208 for a bottom side of the square region 220 of the wafer 200 (see FIG. 11). Again, the intermediate layer 208 is structured to cover back side portions underneath the chips 202. In contrast to the example explained with reference to FIG. 12, the corners of the intermediate layer rectangles formed underneath the chips are cut away. It is to be remembered that in the bonding process the permanent adhesive will adhere with a great adhesive force to the exposed surface of the product substrate 200, i.e. to the surfaces of the product substrate not covered by the intermediate layer 208, and will adhere to the intermediate layer 208 with a much smaller adhesive force down to an adhesive force of zero. When singulating the chips 202, hatched regions 230 indicated in FIG. 14 are taken away by a dicing blade sawing the wafer. In the cut-away corners a surface of wafer 200 is exposed and adheres with a greater adhesive force to the permanent adhesive. Thus, the chips 202 are still attached to the carrier after singulating. As the exposed surface in the cut-away corners is very small, the bonding force is low and the chips can be separated from the carrier by mechanical means.

Figure 15:
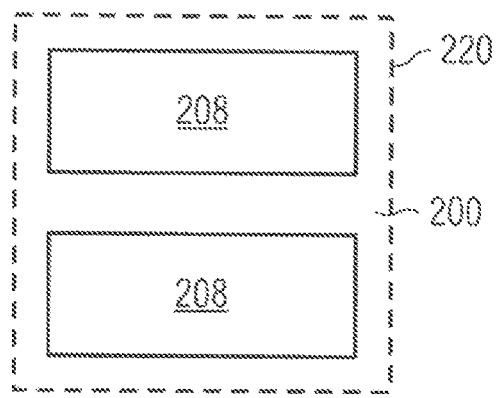
FIG. 15 schematically illustrates in a bottom view the enlarged portion of the carrier of FIG. 11 with another possible structured intermediate layer.

FIG. 15 shows another example of a structured intermediate layer 208 for a bottom side of the square region 220 of the wafer 200 (see FIG. 11). The intermediate layer 208 is structured to cover the backside of two chips 202 being next to each other by one greater rectangle. Less surface of the wafer 200 is exposed. Less exposed surface means a smaller bonding force between the wafer 200 and a carrier. With reference to FIG. 11, an outer region of the wafer 200 does not comprise the chips 202. The backside of the wafer 202 opposite these regions may or may not be covered by the intermediate layer 208 depending on e.g. which bonding force between the wafer 200 and a carrier is desired and/or depending on warpage problems.

Figure 16:
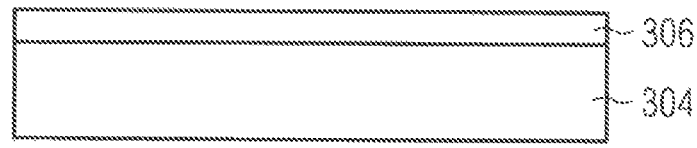
FIG. 16 schematically illustrates in a sectional view a carrier with an applied permanent adhesive layer.

FIG. 16 shows in a schematic side or sectional view a carrier 304 according to another example with a permanent adhesive 306 applied thereto. The carrier 304 may be of any form, for example circular or rectangular and may be adapted to support and to be bonded to any kind of product substrate. Another way of providing an intermediate layer in accordance with the disclosure is explained in the following.

Figure 17:
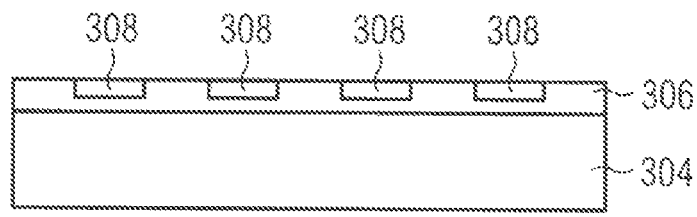
FIG. 17 schematically illustrates in a sectional view a selective transformation or deactivation of the permanent adhesive.

FIG. 17 shows in a schematic sectional view the carrier 304 of FIG. 16 with the layer of the permanent adhesive 306. The permanent adhesive 306 is selectively deactivated in regions 308. These regions 308 form thereby an intermediate layer which does not adhere to the product substrate to be bonded onto the carrier or at least only with a very small adhesive force much less than the adhesive force between the active permanent adhesive 306 and the product substrate. The process of deactivating the permanent adhesive 306 depends on the kind of permanent adhesive used. It may be possible to deactivate the permanent adhesive by, for example, a laser beam. It may be possible to deactivate the permanent adhesive by photolithography. The permanent adhesive may be photosensitive. The form of the regions 308 may be adapted to the active circuits or chips comprised on the product substrate to be supported as explained previously. The form of the regions 308 may, for example, be the same as shown in FIGS. 12 to 15 if the product substrate to be bonded onto the carrier 304 is a wafer as shown in FIG. 11. Other forms of the regions 308 are possible. The permanent adhesive may be deactivated over part of the permanent adhesive layer thickness as shown in FIG. 17 or over the whole permanent adhesive layer thickness. The layer thickness may be of up to 100 μm (micrometer).

Figure 18:
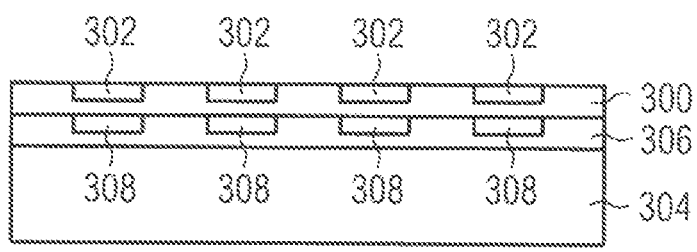
FIG. 18 schematically illustrates in a sectional view a bonded substrate system comprising the carrier of FIG. 17 and a product substrate.

FIG. 18 shows in a schematic sectional view the carrier 304 with the applied permanent adhesive 306 comprising deactivated regions 308 and a product substrate 300 bonded thereto, forming a bonded substrate system in accordance with the disclosure. The product substrate 300 comprises active circuits 302. As already explained with reference to FIG. 17, the product substrate 300 may correspond to the product substrate 200 or the product substrate 100. The product substrate 300 does not need to be provided with an intermediate layer because in the present example, the intermediate layer is formed on the carrier by deactivating the selectively the permanent adhesive layer before the bonding process.

Figure 19:
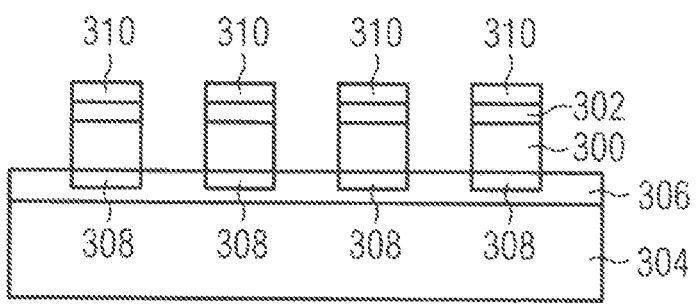
FIG. 19 schematically illustrates the bonded substrate system of FIG. 18 after a dicing step has been performed.

FIG. 19 shows in a schematic sectional view singulating of the chips or active circuits after all processing steps are effectuated. FIG. 19 shows the carrier 304 with applied and cured permanent adhesive 306 and the intermediate layer 308. Although the intermediate layer 308 is formed by deactivating selectively the permanent adhesive, the following explanation is also valid for examples with an intermediate layer formed on the product substrate as explained exemplary for the intermediate layers 108 and 208. It is understood that the difference between the examples of FIGS. 16 to 18 to the examples of FIGS. 1 to 15 is that the intermediate layer is formed in another way, i.e. by deactivating the permanent adhesive while in the other examples the intermediate layer is formed by applying a non-stick layer to the backside of the product substrate. Which kind of intermediate layer is used has no importance for the singulating step. FIG. 19 shows a state after a dicing step has been effectuated. In the example shown, dicing has been stopped at the permanent adhesive layer 306. Dicing may be stopped in the permanent adhesive layer. Dicing is stopped before the carrier 304. The carrier 304 is not damaged and may be used for supporting another product substrate. Carrier 304 may be cleaned from the remains of the permanent adhesive by sufficiently aggressive chemicals. Carrier 304 may be cleaned using plasma processes reducing the permanent adhesive to ashes.

In an example as shown in FIG. 11, dicing may be effectuated along saw lines 212, 214 and dicing may take away hatched regions 230 as indicated exemplary in FIG. 14. The singulated chips comprise the product substrate 300, the active chip 302 and a layer 310 which might correspond to layer 110 explained with reference to FIG. 8. The layer 310 was formed during processing steps necessitating the support by carrier 304. Dependent on the material used for the intermediate layer 106, 206, 306 and the structure of the intermediate layer, as shown in different examples in FIGS. 12 to 15, the singulated chips still adhere slightly to the carrier 304. They may be taken off the carrier 304 as known in the art by pick-and-place apparatuses.

In another example, which is not shown in the figures, it is also possible to place a further temporary carrier covered with a temporary adhesive on top of the singulated chips 302. The temporary adhesive then adheres to the layer 310. The ensemble may then be turned round and the carrier 304 together with the remaining permanent adhesive 306 can be removed. While the chips 302 are still hold together by the temporary carrier next to the layer 310, it is possible to remove the intermediate layer, for example by performing a wet etch, plasma etch or any other process known in the art.

Dicing for singulating the chips may be effectuated by different dicing or separating methods which may also be combined. In an example, dicing is effectuated with a saw up to the permanent adhesive and then a laser beam is used for separating the permanent adhesive.

In an example, a carrier may be bonded to a product substrate using a temporary adhesive in accordance with the disclosure. The temporary adhesive may have a release mechanism which is activated by temperatures below room temperature. The temporary adhesive may have a release temperature below 0° C. Debonding may be effectuated by low temperatures below −100° C. or below −150° C., e.g. in a so-called kryo process. The temporary adhesive may provide an adhesive force comparable to the permanent adhesive discussed above. The temporary adhesive may comprise as adhesive material or as adhesive component the permanent adhesive discussed above.

The temporary adhesive in accordance with the disclosure may be operative in a temperature range starting from room temperature (20° C.) up to about 400° C. Being operative means that no debonding occurs in the mentioned temperature range. When using this temporary adhesive, an intermediate layer as explained above may be omitted. The temporary adhesive may also be combined with the intermediate layer to support the debonding process by low respectively very low temperatures.

The temporary adhesive in accordance with the disclosure may comprise in addition to the adhesive material a filler material which exhibits a CTE which is much lower than a CTE of the adhesive material itself. The CTE of the adhesive material itself may be greater than the CTE of the filler material by a factor of about 10. A CTE of a filler material may be less than 3 while the CTE of the adhesive material may be greater than 20. The CTE of the filler material and the CTE of the adhesive material itself may be both positive. When cooling down the temporary adhesive, the filler particles contract much less than the adhesive. The difference in thermal reaction leads to stress inside an adhesive layer and consequently, delamination and/or forming of cracks may occur. The delamination and/or the cracks may lead to a debonding or may facilitate debonding.

In another example, the temporary adhesive in accordance with the disclosure may comprise a filler material which exhibits a negative thermal expansion while the adhesive material itself may exhibit a positive thermal expansion. When cooling down the temporary adhesive, the filler particles expand while the adhesive contracts or crystallizes. The contrary thermal expansion leads to stress inside an adhesive layer or at an interface to the product substrate or the carrier and consequently, delamination and/or forming of cracks may occur. The delamination and/or the cracks may lead to a debonding or may facilitate debonding.

A possible filler material is zirconium tungstate ($Zr(WO_4)_2$). Zirconium tungstate is a metal oxide and has a negative CTE of about $-7.2 \cdot 10^{-6}$ $K^{-1}$ over a wide temperature range. Possible adhesive materials to be combined with a zirconium tungstate filler are e.g. epoxide, polyimide, silicone, polybenzoxazole (PBO) or thermoplastics in general. A CTE of the adhesive material may be about 20 to 30 $10^{-6}$ $K^{-1}$. Another possible filler material may be a glass ceramic. Possible glass ceramic may be BaO (barium oxide), $Al_2O_3$ (aluminum oxide) or $B_2O_3$ (boron trioxide). Glass ceramics have low positive or even negative CTEs depending on temperature. Another possible filler material may be invar, a FeNi alloy with 36% of nickel as already mentioned above. Invar has a CTE of about 0.

In an example, the filler material is arranged as a separate layer parallel to the adhesive layer, possibly between two adhesive layers. In a further example, the filler material is used in form of particles or in other words in form of a powder embedded in the adhesive layer.

Figure 20:
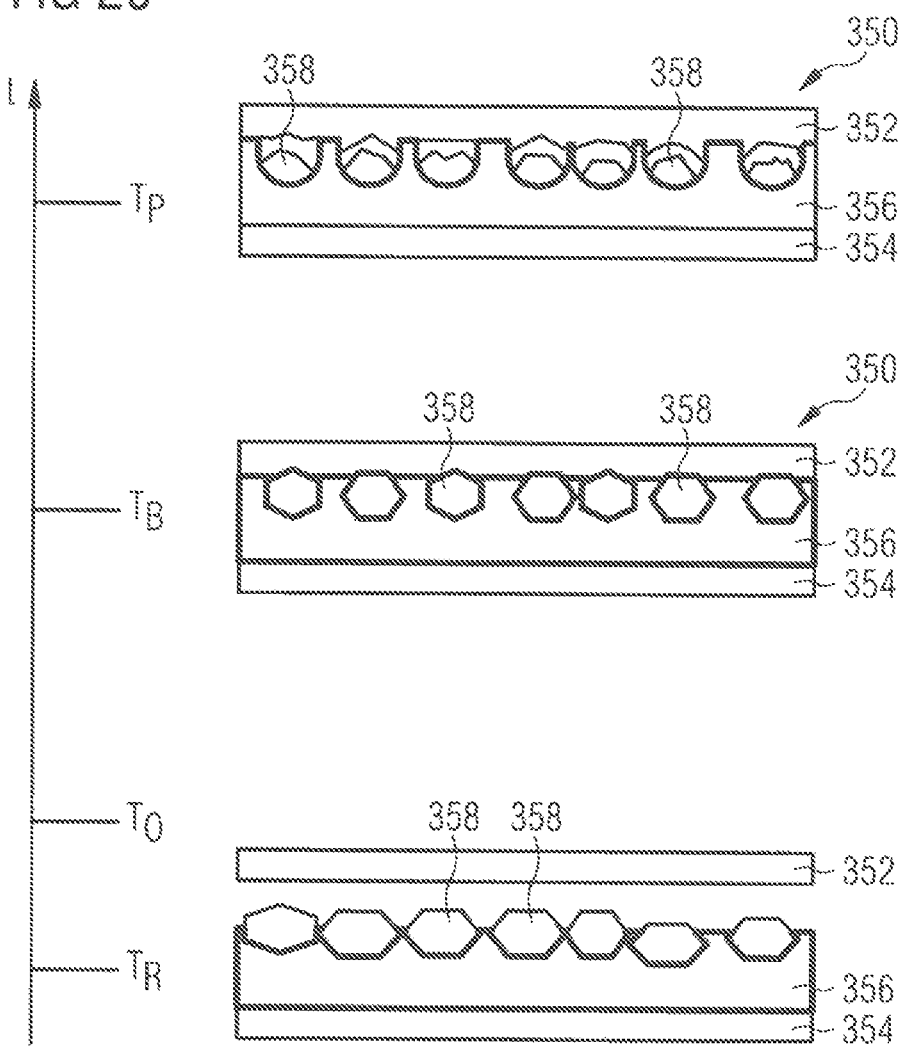
FIG. 20 illustrates a behavior of an adhesive layer with incorporated filler particles for different temperatures.

FIG. 20 illustrates an example with a filler material in form of particles. On the left side of FIG. 20 a temperature scale is drawn for a temperature experienced by a bonded substrate system 350. The temperature scale indicates four temperatures: a temperature $T_P$ is a process temperature which may be as high as 400° C., or about 200° C. A temperature $T_b$ is a bonding temperature at which bonding, e.g. curing of the adhesive, may be effectuated. The bonding temperature may be about 80° C.-200° C. A temperature $T_0$ is a room temperature which may be 20° C. A temperature $T_R$ may be a release temperature which may be a temperature below 0° C., and even as low as −100° C. or −150° C.

The bonded substrate system 350 comprises a product substrate 352, a carrier 354, and a temporary adhesive layer comprising an adhesive material 356 and filler particles 358. At the bonding temperature $T_B$ represented in the middle of FIG. 20, filler particles 358 have a first size when the adhesive 356 is hardened around. The carrier 354 adheres securely to the product substrate 352. At a processing temperature $T_P$ greater than bonding temperature $T_B$ the filler particles 358 have decreased in size, when the filler material has a negative CTE. For a small positive CTE or a CTE of 0 (invar) the size of the filler particles 358 remains the same but as the CTE of the adhesive 356 is much greater, there is still a relative decrease of the filler particles as shown at the top of FIG. 20. There is no decrease of the bonding force. At the release temperature $T_R$ well below room temperature the filler particles 358 have increased in size for a negative CTE and have at least relatively increased compared to the adhesive 356 in case of a small positive CTE or a CTE of 0. Hence, a mechanical stress may occur at the adhesive interface and a bonding force may be greatly reduced. Debonding of the product substrate may be easy using little mechanical force or even no mechanical force at all.

Figure 21:
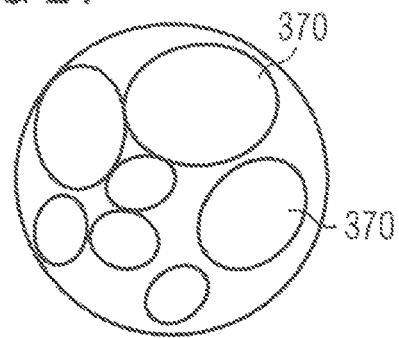
FIG. 21 illustrates a behavior at an adhesive interface at a release temperature for an adhesive layer comprising a layer of filler material.

FIG. 21 shows a schematic top view on an adhesive interface where filler particles have been arranged in a separate layer. FIG. 21 shows a release state, i.e. a state at a release temperature $T_R$ which may be the same as explained with reference to FIG. 20, i.e. a temperature below 0° C. Due to the different CTEs delamination occurs over great surfaces 370. Debonding is greatly facilitated.

Figure 22:
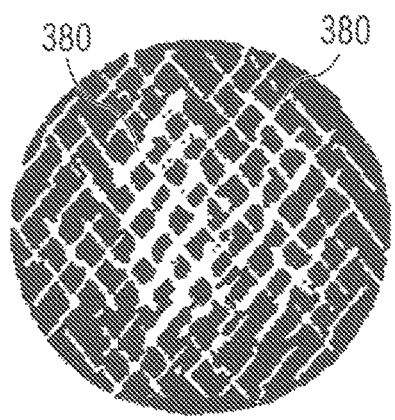
FIG. 22 illustrates another behavior at an adhesive interface at a release temperature for an adhesive layer comprising a layer of filler material.

FIG. 22 shows a schematic top view on an adhesive interface where filler particles have been arranged in a separate layer. FIG. 21 shows a release state, i.e. a state at a release temperature RT which may be the same as explained with reference to FIG. 20, i.e. a temperature below 0° C. Due to the different CTEs cracks 380 have formed over the whole interface. Debonding is greatly facilitated. The kind of release mechanism occurring may depend on the materials and the temperatures and/or temperature curves used.

As already explained above, the material of the carrier used is adapted to the product substrate to be supported. Especially, the coefficient of thermal expansion (CTE) should be about the same for the product substrate and the carrier, preferably over a greater temperature range, e.g. the whole temperature range used during processing on the bonded substrate system. A possible material for a carrier to be temporary attached to a reconstituted wafer, e.g. an eWLB may be an iron-nickel-alloy.

Figure 23:
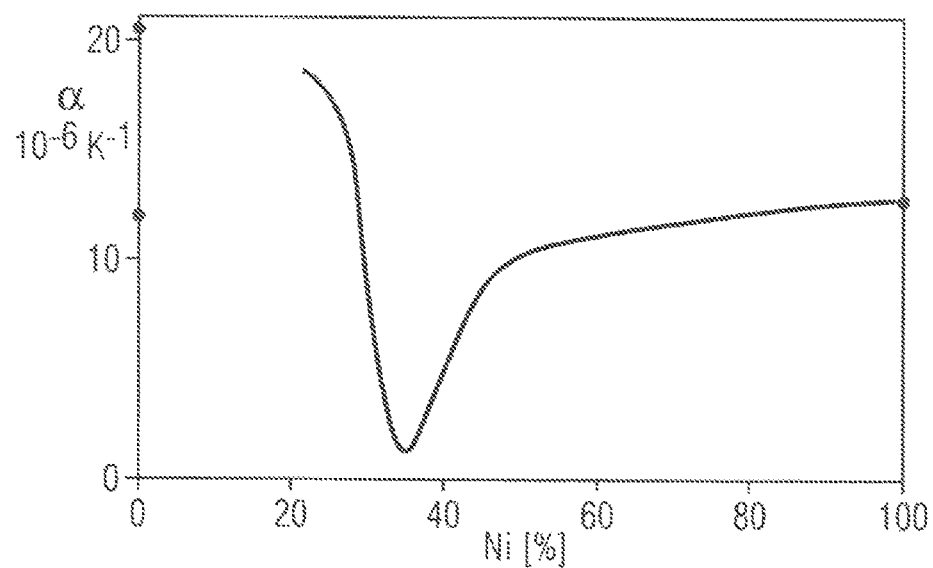
FIG. 23 shows a graph illustrating a behavior of an expansion coefficient α for an iron-nickel-alloy depending on the percentage of nickel in the alloy.

FIG. 23 shows a graph illustrating the thermal expansion coefficient CTE or α for an iron-nickel-alloy depending on the percentage of nickel included in the alloy. It becomes apparent that for a percentage of nickel of about 36 the CTE is especially low. Examples of commercially sold iron-nickel-alloys are Pernifer 39 (CTE 3.5 ppm from 20 to 200° C.), Pernifer 41LC (CTE 4.3 ppm from 20 to 200° C.) or Pernifer 42 (CTE 5.5 ppm from 20 to 200° C.). The iron-nickel alloy with the lowest CTE, Pernifer 36, may be used with a CTE of below 2 in the range of 20 to 200° C. From simulations it is known that for an eWLB the target CTE is in the range of 4.5. Using the alloy 42 Ti the simulated warpage for 200 mm wafer with 5 mm dies (or chips) and 5.5 mm eWLB at 300 μm (micrometer) thickness (0.2 mm thickness of silicon (Si), 0.1 mm thickness of mold compound) reduces from a warpage of 1.7 mm down to a warpage of 0.05 mm with an attached alloy thickness of 0.1 mm.

As these alloys are hard metals, they provide excellent stability and they are easy to stamp or saw. Further, they can be etched by standard processes. The effectiveness of the carrier in terms of avoiding warpage is better, the thinner the eWLB wafer is compared to the thickness of the metal carrier. The above-mentioned materials are low-cost for small thickness, e.g. for thicknesses of the carrier of about a few hundred micrometers.

Figure 24:
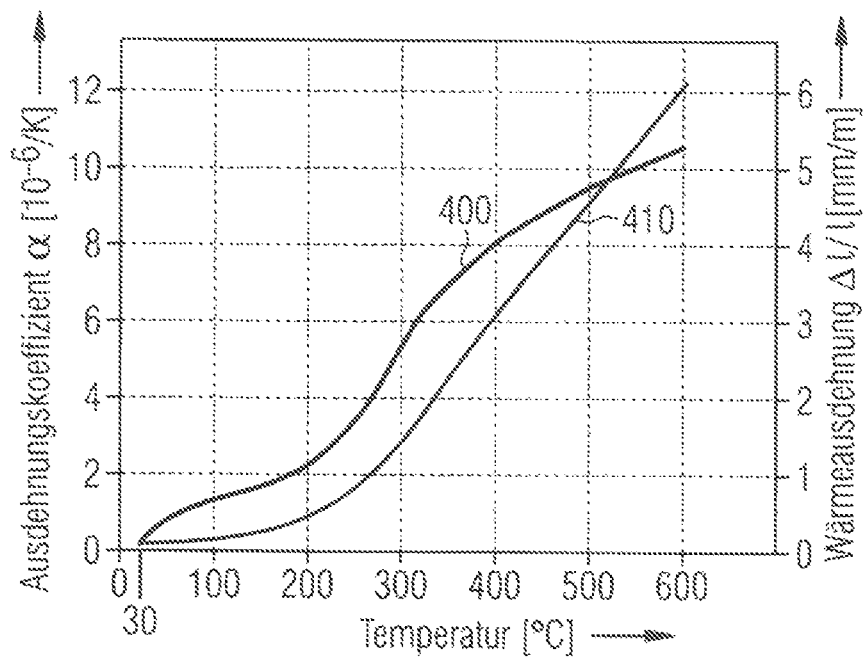
FIG. 24 shows a graph illustrating the dependence of the expansion coefficient α respectively the thermal expansion over temperature for an iron-nickel-alloy comprising 36% of nickel.

FIG. 24 shows a graph illustrating the thermal behavior for the material Pernifer 36, which is an iron-nickel-alloy with 36% of nickel in the alloy. More precisely, the graph shows the behavior of the coefficient of thermal expansion (CTE) also called expansion coefficient α in dependence of the temperature in a line 400 and the thermal expansion Δl to l in millimeter per meter over temperature in a line 410.

In an example, the alloy carrier is provided as a plate with the dimensions of a reconstituted wafer to be supported. For example, this may be a circular plate with a diameter of about 200 mm. The alloy carrier may be provided by stamping or by any other suitable process. The alloy carrier may be put into a mold tool prior to molding the reconstituted wafer in the mold tool. This example is especially applicable in an example where the carrier is supposed to remain as a part of the final electric component, i.e. after dicing the wafer.

To hold the carrier during molding, either a mold foil or the tool used may have at least one of the following capabilities. The foil may be perforated and allow a vacuum applied to hold the carrier. The foil may have bigger cut-outs at the parts where the carrier is. As another example, the foil may stick to the carrier. Or a stamp of the mold tool may carry a permanent magnet or an electro-magnet and hold the carrier in the tool during molding. It may be necessary to further adjust the carrier with respect to the mold tool. The adjustment may be done mechanically by spacers or by magnetic adjustment. With an adapted alloy carrier molded on the backside of an eWLB wafer it is possible to achieve a low warpage. This may be done directly in-situ during the embedding process of the dies in the eWLB wafer.

For the case of the alloy carrier not remaining after processing, the carrier may be removed at the end of the processing by, for example, etching or grinding, or any other step.

Figure 25:
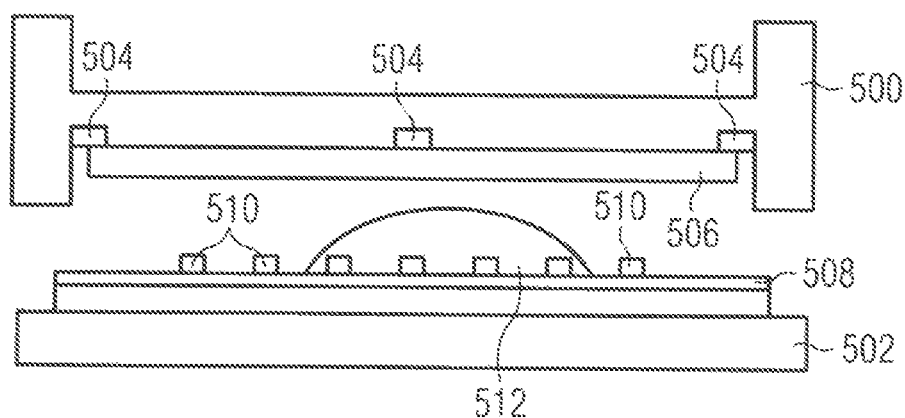
FIG. 25 schematically illustrates a molding tool for forming a reconstituted wafer in an open state.

FIG. 25 shows schematically a molding tool for molding a reconstituted wafer in an open state. The molding tool comprises an upper molding form or stamp 500 and a lower molding form 502. The upper molding form 500 may be provided with magnets 504, three of which are visible in FIG. 25, adapted to hold and adjust a carrier 506. The lower molding form 502 may be provided with a temporary adhesive 508 onto which dies or chips 510 are attached. A molding compound 512, e.g. in a liquid form or in a powder form is dispensed onto the center of the molding form 502.

Figure 26:
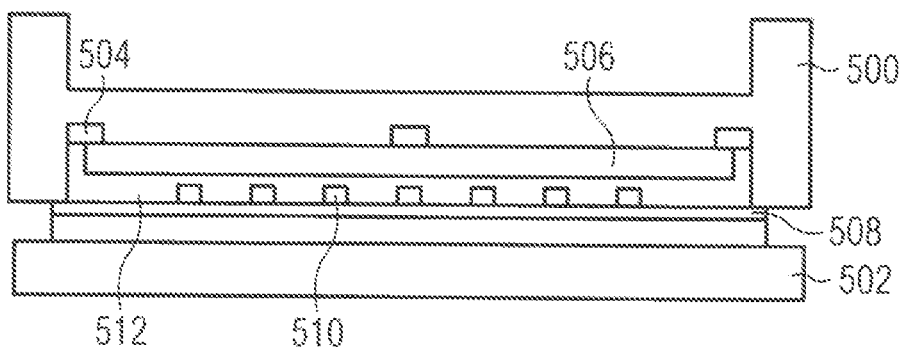
FIG. 26 schematically illustrates the molding tool of FIG. 25 in a closed state.

FIG. 26 shows the molding tool of FIG. 25 in a closed state. The molding compound 512 is pressed into the desired form embedding the chips 510 and the carrier 506. The molding compound 512 may then be cured, e.g. by heat or radiation.

Figure 27:
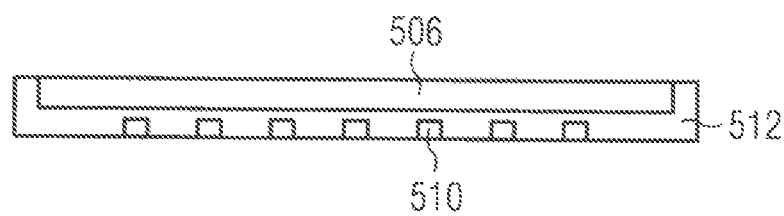
FIG. 27 schematically illustrates the reconstituted wafer formed according to FIGS. 25 and 26 comprising a carrier molded in the reconstituted wafer.

FIG. 27 shows the reconstituted wafer as formed according to FIGS. 25 and 26 after release from the molding tool. The carrier 506 is securely attached to the molding compound 512 and prevents warping of the reconstituted wafer.

It may also be possible to glue a metal carrier only with some glue dots to the backside of a product substrate to prevent warpage. In this case it may be possible to separate the wafer after processing from the carrier by sawing through the glue dots. Another possibility would be to dissolve the glue dots by chemicals.

Figure 28:
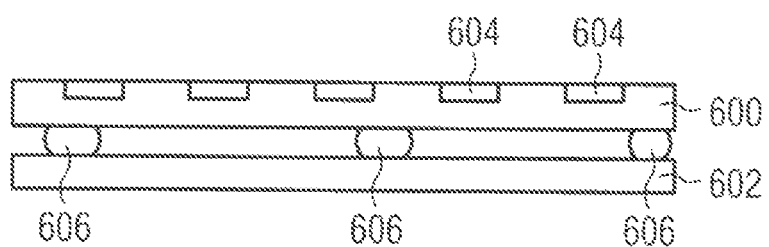
FIG. 28 schematically illustrates a product substrate fixed to a carrier by glue dots or solder dots.

FIG. 28 shows in a schematic sectional view a reconstituted wafer 600 comprising chips 604. The reconstituted wafer 600 is glued by glue dots 606 to a carrier 602. The glue dots may also be replaced by solder dots or soldering points. In this case a hard solder may be used.

Figure 29:
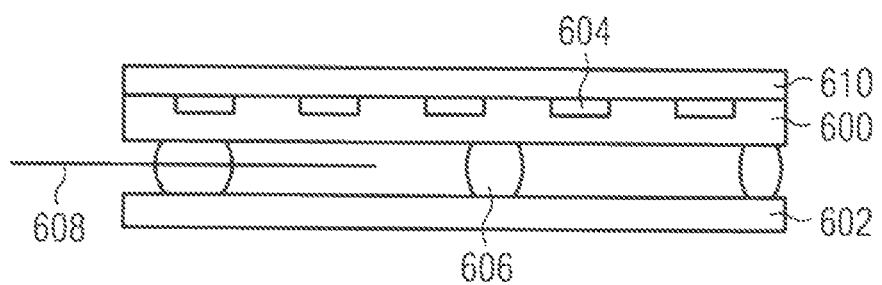
FIG. 29 schematically illustrates a separation of the product substrate of FIG. 28 from the carrier.

FIG. 29 shows a possible separation of the carrier 602 from the wafer 600 after several processing steps have been performed, the processing steps forming an upper layer 610 which may be a redistribution layer. Separation is e.g. effectuated by a sawing step using a sawing blade 608. The sawing step may be parallel to a surface of the carrier 602. Other possibilities for separating the wafer 600 and the carrier 602 may be wire eroding or wire cutting or other mechanical separation techniques. In an example where soldering points are used, separation may also be done either by a melt-off or fusing. During separation of the carrier 602 and the wafer 600, the wafer 600 may be hold by a wafer chuck and the carrier 602 may be hold by a carrier chuck (not shown).

Although specific embodiments have been illustrated and described herein, it will be appreciated by those of ordinary skill in the art that a variety of alternate and/or equivalent implementations may be substituted for the specific examples shown and described without departing from the concept of the present invention. This application is intended to cover any adaptations or variations of the specific examples discussed herein. Therefore, it is intended that this invention will be limited only by the claims and the equivalence thereof.

What is claimed is:

1. A method for handling a product substrate, the method comprising:
    bonding a carrier to the product substrate by:
        applying a layer of a permanent adhesive onto a surface of the carrier;
        providing a structured intermediate layer; and
        bonding the carrier to the product substrate using the applied permanent adhesive,
    wherein the structured intermediate layer is arranged between the product substrate and the carrier,
    wherein a surface of the structured intermediate layer and a surface of the permanent adhesive are in direct contact to a surface of the product substrate,
    wherein the structured intermediate layer decreases a bonding strength between the product substrate and the carrier,
    wherein the product carrier is subject to warpage, and wherein the structured intermediate layer is structured to allow a greater surface of the permanent adhesive to contact the product substrate in regions of greater warpage and to allow a smaller surface of the permanent adhesive to contact the product substrate in regions of less warpage.

2. The method of claim 1, further comprising separating the carrier from the product substrate after performing a number of process steps on the product substrate.

3. The method of claim 1, wherein the structured intermediate layer is formed on the product substrate.

4. The method of claim 3, wherein forming the structured intermediate layer comprises applying an unstructured intermediate layer on the product substrate and subsequently structuring the intermediate layer to form the structured intermediate layer.

5. The method of claim 3, wherein forming the structured intermediate layer comprises applying a structured intermediate layer on the product substrate.

6. The method of claim 5, wherein the structured intermediate layer is applied by printing.

7. The method of claim 1, wherein the structured intermediate layer penetrates into the permanent adhesive.

8. The method of claim 1, wherein the structured intermediate layer is a non-stick coating.

9. The method of claim 1, wherein the structured intermediate layer is formed by selectively deactivating the permanent adhesive before bonding the product substrate to the carrier.

10. The method of claim 1, wherein the product substrate is one of a semiconductor wafer, a reconstituted wafer, a laminate, and a circuit board.

11. The method of claim 1, wherein the carrier is one of a metal plate, a wafer, a plastic disc, and a laminate.

* * * * *